May 24, 1960 L. G. KITCHENS ET AL 2,937,962

TRANSISTOR DEVICES

Filed March 20, 1957

INVENTORS
LEE G. KITCHENS AND
BOYD CORNELISON

BY Stevens, Davis, Miller & Mosher
ATTORNEYS 2,937,962
Patented May 24, 1960

2,937,962

TRANSISTOR DEVICES

Lee G. Kitchens and Boyd Cornelison, Dallas, Tex., assignors to Texas Instruments Incorporated, Dallas, Tex., a corporation of Delaware Filed Mar. 20, 1957, Ser. No. 647,423

3 Claims. (Cl. 148—33)

Figure 1:
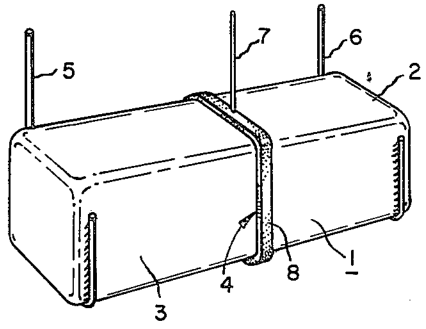

This invention relates to transistors and more particularly to grown junction transistors with improved frequency response and to transistors having an improved apparent beta, lowered saturation resistance and a lowered effective base resistance.

It is well known that one of the factors greatly affecting the frequency response of junction transistors is the equivalent base resistance of the transistor. This is true because at sufficiently high input signal frequencies, the emitter junction no longer functions as a pure resistance, but has a capacitive component. The effect is that the equivalent emitter-base junction resistance is shunted by a capacitance, the impedance of which decreases as frequency increases. Thus, at higher frequencies, the transistor acts somewhat as a low pass filter and its input circuit may be represented by a parallel resistance and capacitance network, representing the emitter-base resistance and capacitance, in series with a resistance representing the base spreading resistance. The response of the transistor therefore falls rapidly at frequencies at which the impedance of the parallel network in the equivalent circuit approaches the same value as the series resistance.

It follows then that if the base spreading resistance of the transistor (the series resistance of the equivalent circuit noted above), can be reduced, the frequency response of the transistor will improve.

The base spreading resistance of the transistor is determined by (1) the resistivity of the material of the base, (2) the thickness or width of the base region and (3) the cross-sectional area of the base region. The resistivity of the material of the base region affects not only the base spreading resistance but also the emitter efficiency, the collector barrier capacitance, and the break-down voltage of the unit. Thus, reduction of the base spreading resistance by lowering the resistivity of the base material is impractical since this method has the undesirable effect of also lowering the emitter efficiency, increasing the collector barrier capacity and lowering the break-down voltage of the unit. Methods changing the other factors mentioned above to lower the base spreading resistance of transistors have been pushed almost to the limit. For example, base regions so narrow as to be impossible to measure by physical means have been achieved. Also, the cross-sectional area of the base has been reduced by reducing the bar size as much as possible without impairing the structural strength of the bar. Both of these methods of lowering the equivalent base resistance greatly improved the frequency response of transistors, however, there was still much to be desired.

Attempts to achieve still better frequency response in transistors led to the development of the tetrode transistor. In the tetrode transistor the effective cross-sectional area of the base region is still further reduced without reducing its physical size by attaching a second base lead on the opposite side of the bar from the normal base lead and applying a voltage between the second base lead and the normal base lead as a bias voltage. This bias voltage is the same polarity as, but of greater magnitude than, the base-emitter bias voltage. A voltage gradient is thus produced through the cross-section of the base region such that only a small part of the total area of that region is biased properly with respect to the emitter for transistor action. Such an arrangement produces a desirable increase in frequency response but requires additional circuitry in each stage where it is used.

By the present invention, base lead contact is made to all exposed portions of the base material instead of only to a very limited area as is usual for base contacts. Thus, the center of the base region constitutes the point farthest from the base contact instead of, as in prior art units, the point on the opposite side of the base region from the contact. The effective resistance due to the bulk of the material is then much reduced because the mean path length for carriers flowing between the emitter and base electrodes is reduced. The preferred method of providing such a base lead connection according to the present invention is by selectively electroplating a material of high conductivity to the exposed base region of the transistor bar. By this same plating technique the bulk resistance of other regions of the transistor bar may also be reduced.

It is therefore one object of the present invention to provide a high frequency transistor in which improved frequency response and the gain are achieved by effectively lowering the base spreading resistance of the unit in a manner which does not substantially effect the other properties of the unit.

It is a further object of the present invention to provide a high frequency triode transistor having a frequency response comparable to that of tetrode transistors.

It is a still further object of the present invention to provide a high frequency transistor requiring less complicated external circuitry than previous transistors of comparable frequency characteristics.

It is a still further object of the present invention to provide triode transistors having much higher gain at all frequencies than triode transistors previously available.

It is another object of the present invention to provide a grown junction transistor having a much lower saturation resistance than prior art transistors of the same or similar type.

Figure 3A:
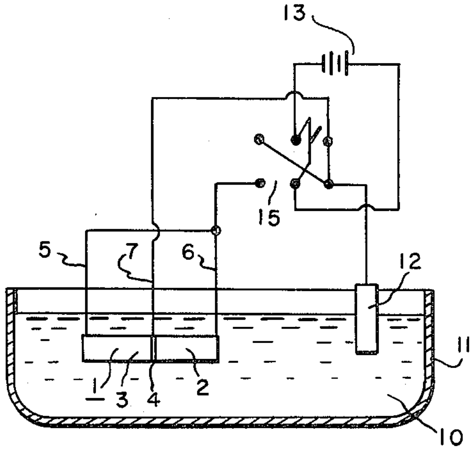
Figure 3B:
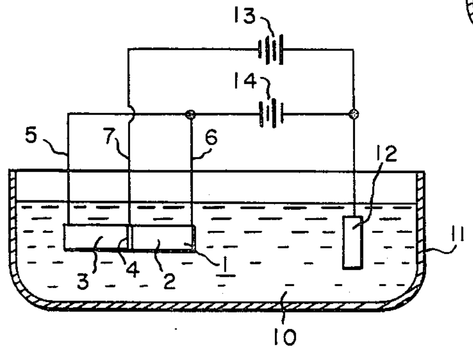
Figure 4:
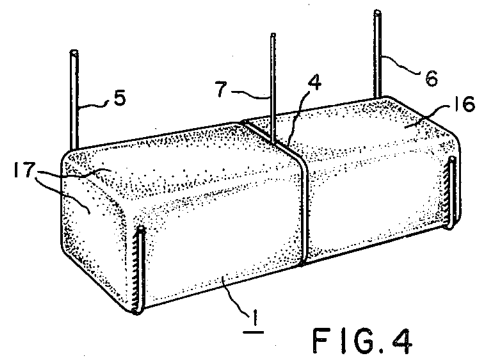
Figure 2A:
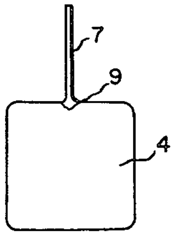
Figure 2B:
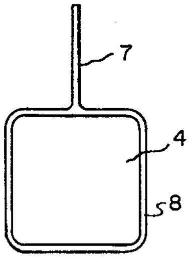

Other and further objects of the present invention will become apparent from the following detailed description when taken together with the accompanying drawing in which:

Figure 1 is a perspective view of a transistor provided with a base contact according to the present invention;

Figure 2*a* is a cross-sectional view at the base region of a prior art grown junction triode transistor;

Figure 2*b* is a cross-sectional view at the base region of the high frequency transistor of the present invention;

Figures 3*a* and 3*b* illustrate two methods of producing the base contact for transistors of the present invention; and, Figure 4 is a perspective view of a transistor with emitter and collector contacts according to the present invention.

Referring now to Figure 1, there is shown the high frequency transistor of the present invention. It comprises a grown junction transistor bar 1 which may be of germanium, silicon or other semiconductor material suitable for use as transistors. The bar contains the usual three regions, namely, two end regions 2 and 3 of one type conductivity material either N or P, which constitute the emitter and collector regions, respectively, and a narrow region 4 of opposite type conductivity material, either P or N, between the two end regions called the base. Leads 5 and 6 provide electrical connections to the collector and emitter respectively and are affixed to the bar as by soldering or other suitable method. A third lead 7 provides electrical connection to the base region through a ring 8 of material of good conductivity making intimate contact with the entire periphery of the base region 4 but no contact with either the emitter or collector regions except through the base region.

As mentioned above such a ring base contact has the effect of lowering the equivalent base resistance of the unit from that resulting when the base contact is a small area contact on one side of the bar as in prior art units. Figures 2*a* and 2*b* illustrate how the ring base contact produces the effect of a lowered base resistance. Figure 2*a* shows a cross-section at the base region 4 of a prior art transistor with the base contact lead 7 providing the small area contact at 9 mentioned above. Such a contact is usually made by fusing or alloying a wire lead into the base region of the bar. Figure 2*b* shows a cross-section at the base region 4 of a transistor according to the present invention wherein the base lead 7 is provided with a much larger area contact to the base region 4 through the ring of highly conductive material 8. In both the prior art transistor of Figure 2*a* and the new transistor of Figure 2*b*, the equivalent base resistance is a function of the resistivity of the material of the base region, the thickness and cross-sectional area of the base region and the mean path length for carriers flowing between the emitter and the base. Thus, if the transistors of Figures 2*a* and 2*b* are identical in base material resistivity, base thickness and area, the equivalent base resistance of the transistor of Figure 2*b* will be much less than that of the transistor of Figure 2*a* since the mean distance from all points in the base region to the base contact 8 in Figure 2*b* is much less than the mean distance for all points in the base region to the base contact 9 of Figure 2*a*.

The preferred method of providing the large area base contact to ordinary grown junction transistors to form the improved transistor of the present invention is by selectively electroplating the base region of the transistor bar as illustrated in Figures 3*a* and 3*b*. In Figures 3*a* and 3*b* the transistor bar 1 to which the large area base contact is to be made, with leads 5, 6 and 7 connected to the three regions of the transistor bar as designated above, is submerged in a plating solution 10 held in a suitable container 11. Also submerged in the solution is the plating electrode 12. A plating current supply, which may be any suitable D.-C. electrical power source such as a battery 13, is connected with its negative terminal to the base region 4 of the transistor bar 1 and its positive terminal to the plating electrode 12 (switch 15 is thrown to the right in the drawing). Material from the plating electrode 12 is thus deposited on the base region 4 of the transistor bar 1 but because of the comparatively high resistivity of the material of the bar plating current to the bar falls off rapidly with distance along the bar from the base region. Thus, little or no material is plated on the emitter and collector regions of the bar.

The transistor bar 1 may be of germanium, silicon or other semiconductor material suitable for use in transistors. The transistor bar may be of any of the various types of grown junction bars produced by any of the several processes such as, for example, the double doped process, the growth-rate-control process, the melt-back process, the grown-diffused process and others, all well known in the industry. Further, the bar may be of the n-p-n or of p-n-p configuration. The plating electrode may be of almost any metal of good conductivity but the preferred metals are those of groups IIIa and IVa of the periodic chart of elements and the noble metals, gold, silver and platinum. Further, if the base region of the transistor bar to be plated is of p-type conductivity material, it is preferred that the plating material (the plating electrode) be one of the acceptor impurities commonly used in semiconductor materials (aluminum, indium, thallium), or one of the noble metals or an alloy of one of the noble metals with a minor percentage of an acceptor impurity for reasons to be discussed below. Conversely, if the base region of the bar to be plated is of n-type conductivity, it is preferred that the plating material be one of the donor impurities commonly used in semiconductor material (antimony, bismuth), or one of the noble metals or an alloy of one of the noble metals with a small percentage of one of the donor impurities. The plating solution may be any solution suitable for use in electroplating the material of the plating electrode used.

In plating of the base region, small amounts of the plated material may be deposited on the emitter and collector regions or may form across the base junctions shorting the base to the collector and the emitter. This condition may be remedied by a short period of reverse plating or electro-etching of the emitter and the collector. This electro-etching step may be carried out as part of the same process by leaving the transistor bar submerged in the plating solution and connecting the positive terminal of the battery to the emitter and collector leads of the bar and the negative terminal of the battery to the plating electrode. Then, just as the base was plated with material from the plating electrode, the plating electrode will now be plated with material from the emitter and collector regions of the bar. Also, just as the base was plated more rapidly when the battery was connected to the base lead due to the difference in potential between the base and the emitter and collector regions, the emitter and collector are etched more rapidly when the battery is connected to their leads due to a similar difference in potential between the regions of different resistivity type. The complete process can easily be carried out using a double pole double throw switch 15 connected as shown in Figure 3*a*.

A preventative, as opposed to a remedial, solution to the "slop over" problem is possible when the transistor bar to be plated is of the n-p-n type. Such a solution to the problem is illustrated in Figure 3*b* where a second D.C. supply, battery 14 is connected such that the emitter and collector regions of the bar are biased positive with respect to the plating anode and therefore etched. Because the bar is an n-p-n bar, both junctions of the bar are biased in the reverse direction with this connection allowing the base to remain negative with respect to the plating electrode at reasonable plating voltages and currents. Thus while the base region is being plated the emitter and collector regions are being stripped, or even etched at a very low rate, at the same time.

Although the above described plating treatment improves the gain and high frequency response of a unit substantially, it has been found that further treatment improves the gain of the unit still more. This further treatment consists of baking the unit after plating in an inert atmosphere at a temperature of around 500° to 700° C. for times up to 15 minutes or more. Baking times and temperatures for this operation apparently are not in the least critical so long as the plated material fuses or alloys to the base layer of the unit.

Examples of the frequency response improvements produced in grown junction transistors with base contacts of the type described herein, are illustrated in Table I below. All of the transistors listed in the following table were comprised of n-p-n germanium transistor bars cut from growth-rate-controlled process crystals. The plating materials used were gold (bars number 1 and 2) and indium (bars number 3 through 7). The plating solutions were, for gold, 203 gm./l. $K_4Fe(CN)_6$ in water and, for indium, 8.6 gm./l. $In_2(SO_4)_3$ and 24.5 gm./l. $H_2SO_4$ in water.

*Table I*

| Bar No. | Initial gain of unit at 455 kc. before plating, db | Plating Material | Plating Current, µamp. | Time | Gain of unit at 455 kc. after plating, db | Gain of unit at 455 kc. after baking, db |
|---|---|---|---|---|---|---|
| 1 | 29.1 | Gold | 300 | 10 min. | 33.0 | 37.3 |
| 2 | 22.8 | do | 300 | 20 min. | 29.5 | 30.8 |
| 3 | 25.6 | Indium | 250 | 90 min. | 38 | 45 |
| 4 | 31.9 | do | 300 | 30 min. | 33.7 | 36.3 |
| 5 | 33.5 | do | 300 (starting current) | 11 hours | 35.4 | 37.7 |
| 6 | 24.3 | do | 300 | 17 min. | 28 | 30.0 |
| 7 | 22.3 | do | 900 | 23 min. | 30.8 | ---------- |

It is to be realized that the method described above to lower the effective base resistance of a transistor is not limited to that use alone but may be used to lower the effective resistance, due to bulk of the material, of any one or more regions of the transistor bar. For example by suitable change in connections and bias polarities in the plating step, i.e. making the region(s) to be plated negative with respect to the plating electrode, the emitter or collector or both the emitter and collector may be given a coating of highly conductive material. Coating the emitter of a bar increases the apparent beta, i.e., the short circuit current gain of the unit. A conductive coating on the collector region of the bar lowers the saturation resistance ($Rc_S$), often quite drastically. For example, in the following tables, Table II shows the $Rc_S$ befoe plating of seventeen grown junction p-n-p transistors from a production run and Table III shows the $Rc_S$ after plating the collector region of seventeen other grown junction p-n-p transistors from the same production run.

*Table II*

| Transistor #: | $Rc_s$ in ohms |
|---|---|
| 1 | 1000 |
| 2 | 130 |
| 3 | >1000 |
| 4 | 1000 |
| 5 | >1000 |
| 6 | >1000 |
| 7 | 160 |
| 8 | 950 |
| 9 | 760 |
| 10 | >1000 |
| 11 | >1000 |
| 12 | 1000 |
| 13 | 700 |
| 14 | 870 |
| 15 | >1000 |
| 16 | >1000 |
| 17 | 740 |

*Table III*

| Transistor #: | $Rc_s$ in ohms |
|---|---|
| 18 | 120 |
| 19 | 300 |
| 20 | 40 |
| 21 | 170 |
| 22 | 160 |
| 23 | 120 |
| 24 | 610 |
| 25 | 110 |
| 26 | 260 |
| 27 | 20 |
| 28 | 80 |
| 29 | 310 |
| 30 | 40 |
| 31 | 30 |
| 32 | 310 |
| 33 | 210 |
| 34 | 50 |

The results shown above were obtained with an extremely thin coating on the collector region of the bars. In the process used, which is the process now used in production, the gold plating solution was that mentioned previously and the units were plated for about 5 seconds at a plating current of about 3 milliamps to coat both the emitter and the collector regions of the bar as indicated by the shaded areas 16 and 17 of Figure 4. The base region 4 of these transistors is left uncoated.

The foregoing disclosure of the present invention is intended to be illustrative only and in no sense limiting. It is therefore obvious that many changes, variations and modifications may be made without departing from the scope and spirit of the present invention and all such changes, variations and modifications are to be deemed a part hereof.

What is claimed is:

1. A grown junction transistor having a bulk-resistance-lowering noble metal conductive coating covering the emitter region thereof.

2. A grown junction transistor having a bulk-resistance-lowering noble metal conductive coating covering the collector rgeion thereof.

3. A grown junction transistor having a bulk-resistance-lowering noble metal conductive coating covering the emitter region thereof and a second bulk-resistance-lowering noble metal conductive coating covering the collector region thereof.

References Cited in the file of this patent

UNITED STATES PATENTS

| | | |
|---|---|---|
| 2,651,009 | Meyer | Sept. 1, 1953 |
| 2,777,101 | Cohen | Jan. 8, 1957 |
| 2,802,159 | Stump | Aug. 6, 1957 |
| 2,813,233 | Shockley | Nov. 12, 1957 |

FOREIGN PATENTS

| | | |
|---|---|---|
| 755,276 | Great Britain | Aug. 22, 1956 |